US010651326B2

(12) United States Patent
Toya et al.

(10) Patent No.: US 10,651,326 B2
(45) Date of Patent: May 12, 2020

(54) POWER GENERATION CIRCUIT UNIT

(71) Applicant: Sumitomo Electric Industries, Ltd., Osaka-shi (JP)

(72) Inventors: Kazumasa Toya, Osaka (JP); Takashi Iwasaki, Osaka (JP); Youichi Nagai, Osaka (JP); Koji Mori, Osaka (JP); Kenji Saito, Osaka (JP); Rui Mikami, Osaka (JP); Takeshi Yamana, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 193 days.

(21) Appl. No.: 15/325,006

(22) PCT Filed: Jul. 6, 2015

(86) PCT No.: PCT/JP2015/069411
§ 371 (c)(1),
(2) Date: Jan. 9, 2017

(87) PCT Pub. No.: WO2016/006573
PCT Pub. Date: Jan. 14, 2016

(65) Prior Publication Data
US 2017/0213928 A1 Jul. 27, 2017

(30) Foreign Application Priority Data

Jul. 10, 2014 (JP) .................. 2014-142327

(51) Int. Cl.
*H01L 31/0392* (2006.01)
*H05K 1/02* (2006.01)
(Continued)

(52) U.S. Cl.
CPC .. *H01L 31/03926* (2013.01); *H01L 31/02013* (2013.01); *H01L 31/0508* (2013.01);
(Continued)

(58) Field of Classification Search
USPC .................................... 361/748, 761
See application file for complete search history.

(56) References Cited

U.S. PATENT DOCUMENTS

2005/0045855 A1 3/2005 Tonapi et al.
2006/0244177 A1 11/2006 Kaneto et al.
(Continued)

FOREIGN PATENT DOCUMENTS

CN 1856213 A 11/2006
JP 2005-051133 A 2/2005
(Continued)

OTHER PUBLICATIONS

Notice of Allowance issued in co-pending U.S. Appl. No. 14/795,653, dated Dec. 8, 2017 [Related Application; Provided in IFW].
(Continued)

*Primary Examiner* — Andargie M Aychillhum
(74) *Attorney, Agent, or Firm* — Baker Botts, L.L.P.; Michael A. Sartori

(57) ABSTRACT

This power generation circuit unit includes a wiring substrate and a plurality of power generating elements mounted to the wiring substrate. The wiring substrate includes: a first substrate (32E) and a second substrate (32F) to each of which the power generating element is mounted; and a coupling portion (33L) configured to couple the first substrate (32E) and the second substrate (32F) together. The first substrate (32E) can be disposed at least two positions of: a first position separated from the second substrate (32F) by a first distance; and a second position separated from the second substrate (32F) by a second distance being greater than the first distance. The coupling portion (33L) has an FPC (flexible printed circuits). In a state where the first substrate is disposed at the second position, at least a part of the coupling portion (33L) is twisted.

15 Claims, 13 Drawing Sheets

(51) Int. Cl.
*H05K 1/18* (2006.01)
*H01L 31/05* (2014.01)
*H02S 40/22* (2014.01)
*H02S 20/32* (2014.01)
*H02S 30/10* (2014.01)
*H01L 31/02* (2006.01)
*H01L 31/054* (2014.01)
*H02S 40/42* (2014.01)

(52) U.S. Cl.
CPC .......... *H01L 31/0543* (2014.12); *H02S 20/32* (2014.12); *H02S 30/10* (2014.12); *H02S 40/22* (2014.12); *H02S 40/42* (2014.12); *H05K 1/028* (2013.01); *H05K 1/189* (2013.01); *H05K 2201/046* (2013.01); *H05K 2201/09263* (2013.01); *H05K 2201/10121* (2013.01); *Y02E 10/52* (2013.01)

(56) References Cited

U.S. PATENT DOCUMENTS

| | | | |
|---|---|---|---|
| 2011/0132435 A1 | 6/2011 | Nakata | |
| 2011/0155217 A1 | 6/2011 | Yang et al. | |
| 2012/0186860 A1 | 7/2012 | Takaoka | |
| 2012/0279551 A1 | 11/2012 | Garboushian et al. | |
| 2012/0285530 A1 | 11/2012 | Ziegler et al. | |
| 2014/0230883 A1* | 8/2014 | Iwasaki | H01L 31/0504 136/246 |

FOREIGN PATENT DOCUMENTS

| | | |
|---|---|---|
| JP | 2007-019334 A | 1/2007 |
| JP | 2011-210705 A | 10/2011 |
| JP | 2011-210747 A | 10/2011 |
| JP | 2013-080760 A | 5/2013 |
| JP | 2013-084855 A | 5/2013 |
| JP | 2013-153076 A | 8/2013 |
| JP | 2014-035502 A | 2/2014 |
| TW | 201324817 A | 6/2013 |
| WO | 2013/054709 A1 | 4/2013 |

OTHER PUBLICATIONS

Office Action in co-pending U.S. Appl. No. 14/795,653, dated Feb. 7, 2017.
Office Action issued in co-pending U.S. Appl. No. 14/795,653, dated Aug. 3, 2017. [Provided in IFW].
Office Action dated Feb. 1, 2019 for the co-pending U.S. Appl. No. 15/325,045.
Office Action dated Feb. 15, 2019 for the co-pending U.S. Appl. No. 15/324,984.
English translation of Takagi, JP 2001-298217.
International Search Report in International Application No. PCT/JP2015/069404, dated Aug. 11, 2015.
International Search Report in International Application No. PCT/JP2015/069407, dated Aug. 11, 2015.
International Search Report in International Application No. PCT/JP2015/069409, dated Aug. 11, 2015.
International Search Report in counterpart International Application No. PCT/JP2015/069411, dated Sep. 8, 2015.
Non-Final Office Action dated May 1, 2019 for the co-pending U.S. Appl. No. 15/324,984.
Jun. 10, 2019 Office Action issued in U.S. Appl. No. 15/325,034.
Jul. 8, 2019 Office Action issued in U.S. Appl. No. 15/325,045.
Aug. 13, 2019 Office Action issued in U.S. Appl. No. 15/324,984.
Advisory Action issued in U.S. Appl. No. 15/324,984, dated Oct. 23, 2019.
Final Office Action issued in U.S. Appl. No. 15/325,034, dated Oct. 22, 2019.
Final Office Action issued in U.S. Appl. No. 15/325,045, dated Jan. 3, 2020.
Advisory Action issued in U.S. Appl. No. 15/325,034, dated Jan. 30, 2020.

* cited by examiner

POWER GENERATION CIRCUIT UNIT

TECHNICAL FIELD

The present invention relates to power generation circuit units, and in particular, relates to a power generation circuit unit including an FPC (flexible printed circuits).

BACKGROUND ART

There have been developed concentrator photovoltaic apparatuses in which sunlight is converged onto solar cell elements by use of lenses and the like to increase the power generating efficiency of the solar cell elements.

As one example of a concentrator photovoltaic apparatus, Japanese Laid-Open Patent Publication No. 2013-84855 (PATENT LITERATURE 1) discloses a technology as below. That is, a concentrator solar cell module includes: a plurality of solar cell elements; an elongated receiver substrate having the solar cell elements arranged thereon in a single line at constant intervals; and a module substrate having a plurality of the receiver substrates arranged thereon in parallel at constant intervals. In the concentrator solar cell module, each receiver substrate includes: an elongated receiver base; and a plurality of wiring members arranged on the receiver base in a single line along the longitudinal direction, with their adjacent ends facing each other. A positive electrode pad portion is provided on one end of each wiring member, and a negative electrode pad portion is provided on the other end thereof. The positive electrode terminal of each solar cell element is connected to the positive electrode pad portion and the negative electrode terminal of the solar cell element is connected to the negative electrode pad portion, whereby a solar cell element mounting portion is formed.

CITATION LIST

Patent Literature

PATENT LITERATURE 1: Japanese Laid-Open Patent Publication No. 2013-84855

SUMMARY OF INVENTION

Technical Problem

For example, in the concentrator solar cell module described in PATENT LITERATURE 1, when sunlight is converged onto a solar cell element by a lens, the temperature of the solar cell element becomes high. When heat of the solar cell element is transferred to the receiver substrate to which the solar cell element is mounted, the receiver substrate expands due to heat.

The receiver substrate having thermally expanded due to sunlight during daytime contracts to its original size from evening, for example. When the receiver substrate repeats expansion and contraction in this manner, the receiver substrate is degraded early in some cases.

The present invention has been made in order to solve the above problem. An object of the present invention is to provide a power generation circuit unit capable of suppressing temperature increase of a substrate to which power generating elements are mounted.

Solution to Problem (1) A power generation circuit unit according to an aspect of the present invention includes: a wiring substrate; and a plurality of power generating elements mounted to the wiring substrate, wherein the wiring substrate includes: a first substrate and a second substrate to each of which the power generating element is mounted; and a coupling portion configured to couple the first substrate and the second substrate together, the first substrate can be disposed at at least two positions of: a first position separated from the second substrate by a first distance; and a second position separated from the second substrate by a second distance being greater than the first distance, the coupling portion has an FPC (flexible printed circuits), and in a state where the first substrate is disposed at the second position, at least a part of the coupling portion is twisted.

Advantageous Effects of Invention

According to the present invention, it is possible to suppress temperature increase of the substrate to which the power generating element is mounted.

DESCRIPTION OF EMBODIMENTS

Figure 1:
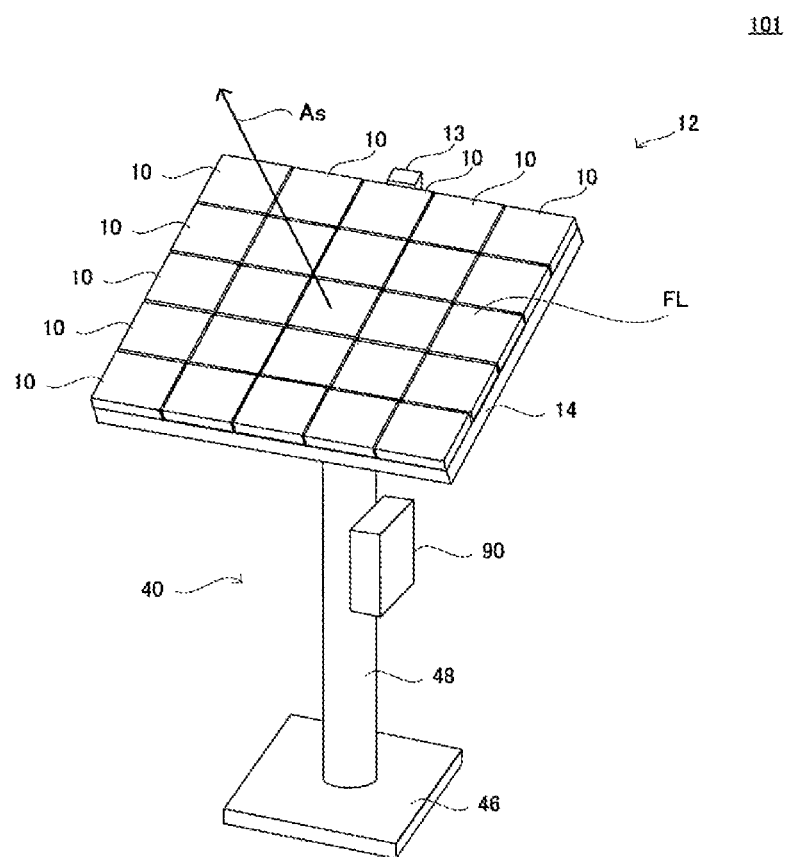
FIG. 1 is a perspective view of a photovoltaic apparatus according to an embodiment of the present invention.

First, contents of embodiments of the present invention will be listed for description.

(1) A power generation circuit unit according to an embodiment of the present invention includes: a wiring substrate; and a plurality of power generating elements mounted to the wiring substrate, wherein the wiring substrate includes: a first substrate and a second substrate to each of which the power generating element is mounted; and a coupling portion configured to couple the first substrate and the second substrate together, the first substrate can be disposed at least two positions of: a first position separated from the second substrate by a first distance; and a second position separated from the second substrate by a second distance being greater than the first distance, the coupling portion has an FPC (flexible printed circuits), and in a state where the first substrate is disposed at the second position, at least a part of the coupling portion is twisted.

With this configuration, the coupling portion can be easily twisted by changing the arrangement of the first substrate. In a state where the coupling portion is twisted, for example, air flowing around the wiring substrate easily hits the coupling portion. Thus, heat transferred from the power generating element to the wiring substrate can be efficiently released from the coupling portion into air. Therefore, it is possible to suppress temperature increase of the substrate to which the power generating element is mounted.

(2) Preferably, in a state where the first substrate is disposed at the second position, at least a part of the coupling portion is positioned above a height position of at least either one of the first substrate and the second substrate.

With this configuration, a greater flow of air easily hits the coupling portion, and thus, the heat dissipation efficiency of the coupling portion can be further enhanced.

(3) Preferably, the coupling portion has a first coupling piece, a second coupling piece, and an intermediate piece, the first coupling piece connects the first substrate and the intermediate piece together, and the second coupling piece connects the second substrate and the intermediate piece together.

Thus, with the configuration in which the coupling portion is divided into a plurality of sections, the coupling portion can be more easily twisted.

(4) More preferably, in a state where the first substrate is disposed at the second position, at least one of the first coupling piece, the second coupling piece, and the intermediate piece is twisted.

With this configuration, while making the coupling portion more easily twisted, it is possible to enhance the heat dissipation efficiency of the coupling portion.

(5) More preferably, in a state where the first substrate is disposed at the second position, both of the first coupling piece and the second coupling piece are twisted.

With this configuration, while making the coupling portion more easily twisted, it is possible to further enhance the heat dissipation efficiency of the coupling portion.

(6) More preferably, in a state where the first substrate is disposed at the second position, the first coupling piece is positioned above a height position of the first substrate.

With this configuration, the heat dissipation efficiency of the coupling portion can be further enhanced.

(7) More preferably, in a state where the first substrate is disposed at the second position, the intermediate piece is positioned above a height position of the first substrate.

With this configuration, the heat dissipation efficiency of the coupling portion can be further enhanced.

(8) More preferably, a length in an extending direction of the first coupling piece is different from a length in an extending direction of the second coupling piece.

With this configuration, for example, in a case where there are a plurality of the coupling portions, the twisting manner of the coupling portions can be more reliably unified.

(9) More preferably, in a state where the first substrate is disposed at the first position, an extending direction of the intermediate piece is different from an extending direction of the first coupling piece.

With this configuration, the coupling portion can be more easily twisted.

(10) More preferably, in a state where the first substrate is disposed at the first position, the extending direction of the intermediate piece is different from an extending direction of the second coupling piece.

With this configuration, the coupling portion can be further easily twisted.

(11) More preferably, in a state where the first substrate is disposed at the second position, a thickness direction of at least a part of the first coupling piece is different from a thickness direction of the first substrate.

With this configuration, air flowing around the wiring substrate easily hits the coupling portion, and thus, the heat dissipation efficiency of the coupling portion can be enhanced.

(12) More preferably, in a state where the first substrate is disposed at the second position, a thickness direction of at least a part of the second coupling piece is different from a thickness direction of the second substrate.

With this configuration, air flowing around the wiring substrate more easily hits the coupling portion, and thus, the heat dissipation efficiency of the coupling portion can be further enhanced.

(13) More preferably, in a state where the first substrate is disposed at the second position, a thickness direction of at least a part of the intermediate piece is different from a thickness direction of at least one of the first coupling piece and the second coupling piece.

With this configuration, air flowing around the wiring substrate easily hits coupling portion, and thus, the heat dissipation efficiency of the coupling portion can be enhanced.

(14) More preferably, in a state where the first substrate is disposed at the second position, a distance between the first substrate and the intermediate piece is different from a distance between the second substrate and the intermediate piece.

With this configuration, for example, in a case where there is a plurality of the coupling portions, the twisting manner of the coupling portions can be more reliably unified.

(15) More preferably, the FPC is continued throughout the first coupling piece, the intermediate piece, and the second coupling piece, the FPC has: a conductive portion provided along an extending direction of the FPC; and an insulating portion configured to cover the conductive portion, and the insulating portion of at least either one of the first coupling piece and the second coupling piece has a wide portion.

With this configuration, for example, in a state where the coupling portion is twisted, in a case where the wide portion is positioned so as to stand relative to the face where the wiring substrate is placed, a distance between the conductive portion and the face can be ensured to some extent. Thus, occurrence of electric discharge between the conductive portion and the face can be prevented.

Hereinafter, embodiments of the present invention will be described with reference to the drawings. It should be noted that the same or corresponding parts are denoted by the same reference signs, and description thereof is not repeated. At least some parts of the embodiments descried below can be combined together as desired.

Embodiment

FIG. 1 is a perspective view of a photovoltaic apparatus according to an embodiment of the present invention.

With reference to FIG. 1, a photovoltaic apparatus 101 includes a photovoltaic panel 12 and a pedestal 40. The photovoltaic panel 12 includes a plurality of photovoltaic modules 10, a sun direction sensor 13, and a frame part 14. The pedestal 40 includes a base 46, a post 48, a function part 90, and a position changeable part not shown.

The photovoltaic panel 12 includes 5 rows×5 columns of the photovoltaic modules 10, i.e., 25 photovoltaic modules 10, for example. The photovoltaic modules 10 are mounted side by side on top of the frame part 14.

Each photovoltaic module 10 receives sunlight to generate power, and outputs, by using wiring not shown, direct-current power which is the generated power, to the function part 90 mounted to a side face of the post 48.

The post 48 is set, for example, on the base 46 provided on the ground, so as to be perpendicular to the ground.

The position changeable part not shown includes a motor. On the basis of a control signal from the function part 90, the position changeable part operates so as to direct toward the sun the direction of a light receiving surface FL of the photovoltaic panel 12, i.e., the direction of the normal line of the light receiving surface FL indicated by an arrow As, such that the direction of the light receiving surface FL tracks the sun from sunrise to sunset.

The sun direction sensor 13 is used for detecting the direction of the sun, and outputs a sensor signal indicating the detection result, to the function part 90.

For example, the function part 90 includes a housing and various types of units accommodated in the housing. Specifically, for example, the housing accommodates: a junction box which connects wires from the respective photovoltaic modules 10; a power conditioner which converts direct-current power outputted from the photovoltaic modules 10, into alternating-current power; a control unit for controlling the orientation of the light receiving surface FL of the photovoltaic panel 12; and the like.

Figure 2:
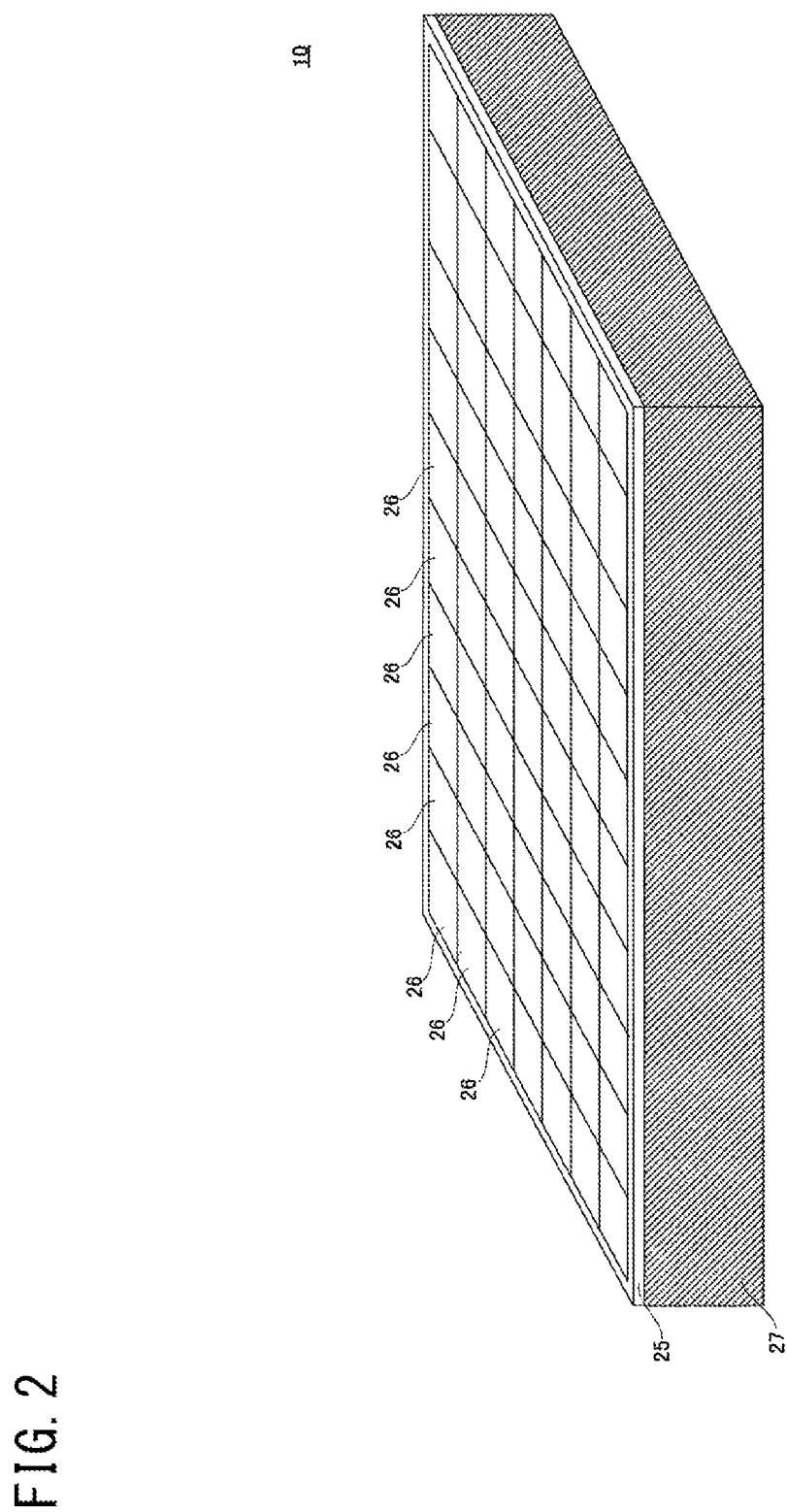
FIG. 2 is a perspective view of a photovoltaic module according to the embodiment of the present invention.
Figure 3:
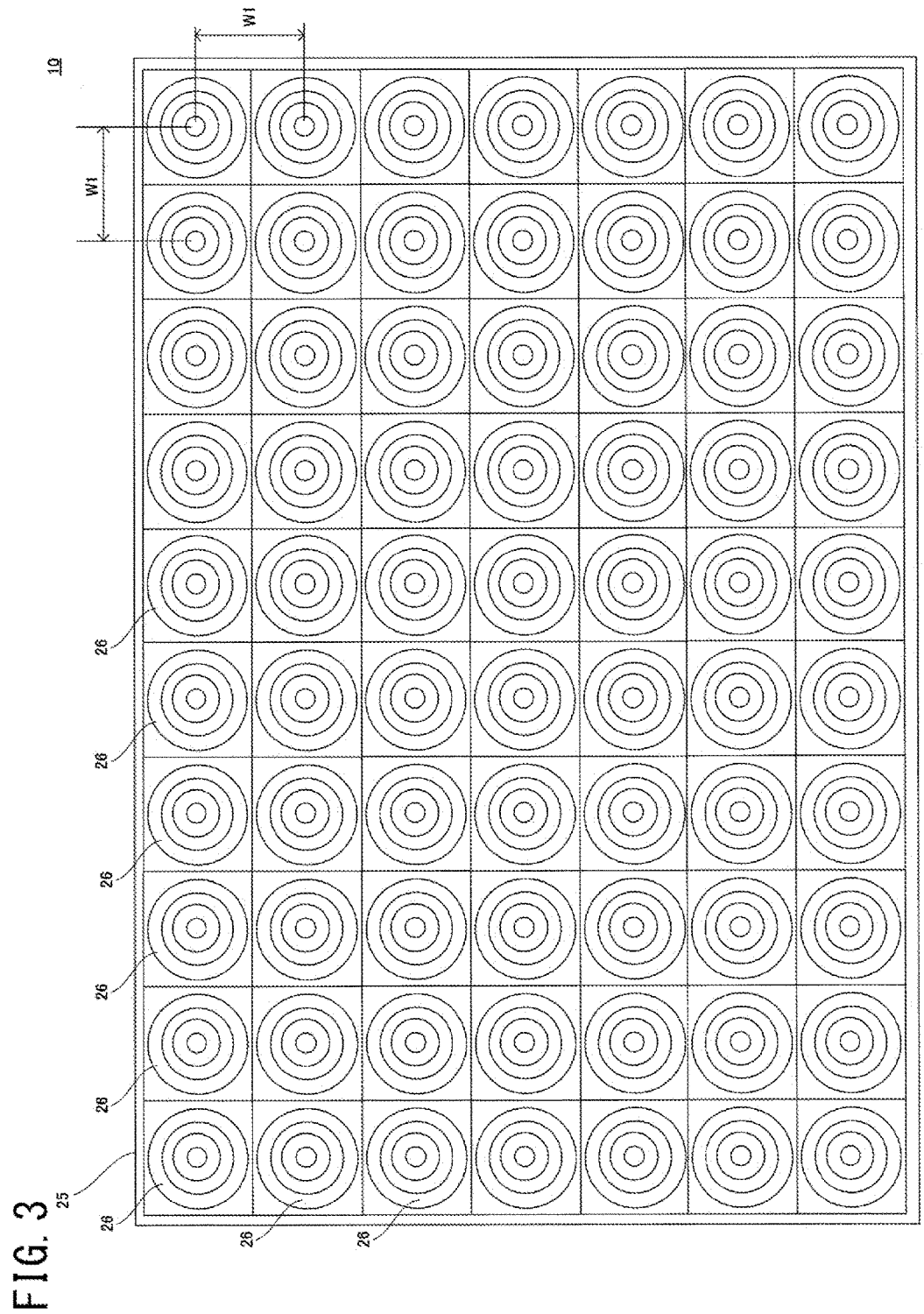
FIG. 3 is a plan view of the photovoltaic module according to the embodiment of the present invention.

FIG. 2 is a perspective view of the photovoltaic module according to an embodiment of the present invention. FIG. 3 is a plan view of the photovoltaic module according to the embodiment of the present invention.

With reference to FIG. 2 and FIG. 3, the photovoltaic module 10 includes a wall portion 27, a bottom not shown, and a concentrating portion 25. The concentrating portion 25 includes a plurality of Fresnel lenses 26.

In the concentrating portion 25, the Fresnel lenses 26 are arranged in a square lattice pattern, for example. Specifically, the Fresnel lenses 26 are arranged such that the distance between the centers of Fresnel lenses 26 that are adjacent to each other is W1, for example. The size of each Fresnel lens 26 is 50 mm×50 mm, for example.

Figure 4:
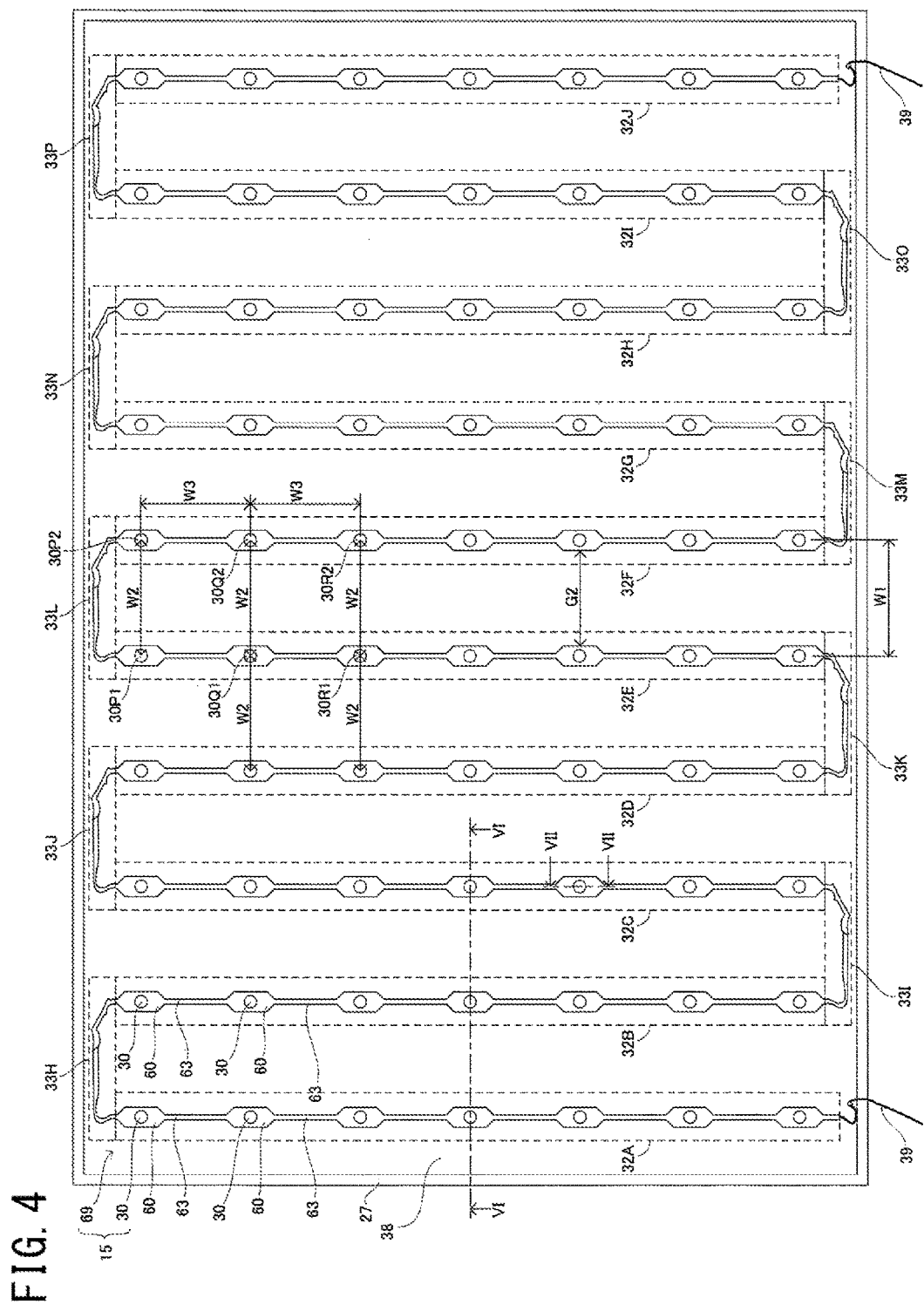
FIG. 4 is a plan view showing a state of the photovoltaic module with a concentrating portion removed according to the embodiment of the present invention.

FIG. 4 is a plan view showing a state of a photovoltaic module with the concentrating portion removed according to the embodiment of the present invention.

With reference to FIG. 4, the photovoltaic module 10 includes: the wall portion 27; a base portion 38 being the bottom of the photovoltaic module 10; a power generation circuit unit 15; and two lead wires 39.

The power generation circuit unit 15 includes: a wiring substrate 69; and a plurality of power generating portions 30 mounted to the wiring substrate 69. Specifically, each power generating portion 30 includes a power generating element not shown, and the power generating element is mounted to the wiring substrate 69.

The wiring substrate 69 includes: strip-shaped substrates (first substrate or second substrate) 32A, 32B, 32C, 32D, 32E, 32F, 32G 32H, 32I, and 32J; and coupling portions 33H 33I, 33J, 33K, 33L, 33M, 33N, 33O, and 33P.

The coupling portion 33H couples the strip-shaped substrate 32A and the strip-shaped substrate 32B together. The coupling portion 33I couples the strip-shaped substrate 32B and the strip-shaped substrate 32C together. The coupling portion 33J couples the strip-shaped substrate 32C and the strip-shaped substrate 32D together. The coupling portion 33K couples the strip-shaped substrate 32D and the strip-shaped substrate 32E together. The coupling portion 33L couples the strip-shaped substrate 32E and the strip-shaped substrate 32F together. The coupling portion 33M couples the strip-shaped substrate 32F and the strip-shaped substrate 32G together. The coupling portion 33N couples the strip-shaped substrate 32G and the strip-shaped substrate 32H together. The coupling portion 33O couples the strip-shaped substrate 32H and the strip-shaped substrate 32I together. The coupling portion 33P couples the strip-shaped substrate 32I and the strip-shaped substrate 32J together.

Hereinafter, each of the strip-shaped substrates 32A, 32B, 32C, 32D, 32E, 32F, 32G, 32H, 32I, and 32J will also be referred to as a strip-shaped substrate 32. In addition, each of the coupling portions 33H, 33I, 33J, 33K, 33L, 33M, 33N, 33O, and 33P will also be referred to as a coupling portion 33. The strip-shaped substrates 32 are arranged parallel to each other.

In FIG. 4, the strip-shaped substrates 32 are disposed such that the distance between strip-shaped substrates 32 that are adjacent to each other is a distance G2. In this state, each coupling portion 33 is twisted. Details of the twist of the coupling portion 33 will be described later with reference to FIG. 11 to FIG. 13.

It should be noted that the wiring substrate 69 may be configured to include a larger number of or a smaller number of the strip-shaped substrates 32 and the coupling portions 33. For example, the wiring substrate 69 may be configured to include a single coupling portion 33 and two strip-shaped substrates 32 coupled by the coupling portion 33.

The lead wires 39 are respectively connected to the two ends of the wiring substrate 69. The lead wires 39 respectively pass through holes provided in the base portion 38, and are connected to the junction box in the function part 90 shown in FIG. 1, for example. The material of the base portion 38 is, for example, aluminium, copper, or the like which has a high heat conductivity and a relatively light weight.

The wiring substrate 69 is placed at and adhered to the upper main surface of the base portion 38, i.e., the main surface on the Fresnel lens 26 side.

In the wiring substrate 69, the strip-shaped substrate 32 includes seven land portions 60 and wire portions 63 each connected to opposite sides of each land portion. Each wire portion 63 connects the land portions 60 together, for example. The width of the land portion 60 is greater than the width of the wire portion 63. Each power generating portion 30 is mounted to the upper main surface of its corresponding land portion 60.

It should be noted that the strip-shaped substrate 32 may be configured to include a larger number of or a smaller number of the land portions 60 and the wire portions 63. For example, the strip-shaped substrate 32 may be configured to include a single land portion 60 and two wire portions 63.

For example, the strip-shaped substrate 32E includes power generating portions 30P1, 30Q1, and 30R1 mounted thereto as the power generating portions 30. The strip-shaped substrate 32F includes power generating portions 30P2, 30Q2, and 30R2 mounted thereto as the power generating portions 30.

The power generating portions 30P1, 30Q1, and 30R1 mounted to the strip-shaped substrate 32E are opposed to the power generating portions 30P2, 30Q2, and 30R2 mounted to the strip-shaped substrate 32F, respectively.

A distance W2 between the power generating portions 30 opposed to each other is equal to a distance W3 between the power generating portions 30 that are adjacent to each other in the strip-shaped substrate 32. Specifically, for example, the distance W2 between the power generating portion 30P1 and the power generating portion 30P2 which are the power generating portions 30 opposed to each other is equal to the distance W3 between the power generating portion 30P2 and the power generating portion 30Q2 which are adjacent to each other in the strip-shaped substrate 32F.

For example, the distance W2 and the distance W3 are equal to a distance W1 between the centers of the Fresnel lenses 26 shown in FIG. 3.

For example, each Fresnel lenses 26 shown in FIG. 3 is provided for one power generating portion 30, correspondingly. Each power generating portion 30 is disposed on the optical axis of its corresponding Fresnel lens 26.

Figure 5:
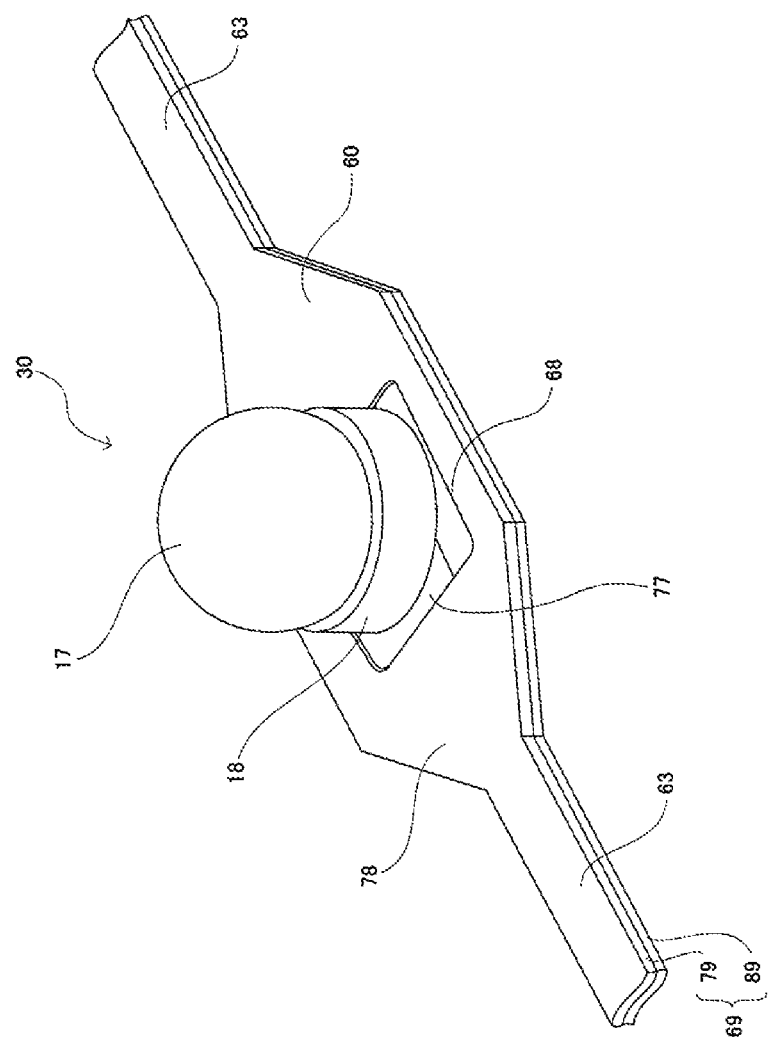
FIG. 5 is a perspective view of a part of a power generation circuit unit according to the embodiment of the present invention.

FIG. 5 is a perspective view of a part of the power generation circuit unit according to the embodiment of the present invention.

FIG. 5 shows a state of the power generating portion 30 mounted to the land portion 60 of the strip-shaped substrate 32 in the wiring substrate 69. With reference to FIG. 5, the wiring substrate 69 includes: a power generating portion 30; an FPC (flexible printed circuits) 79; and a reinforcement plate 89. The FPC 79 includes a conductive portion 77 and an insulating portion 78 which covers the conductive portion 77.

The power generating portion 30 is mounted to the land portion 60 of the wiring substrate 69. Specifically, in the land portion 60, an opening 68 is provided in the FPC 79. In the opening 68, the insulating portion 78 does not cover the upper side of the conductive portion 77, and thus, the conductive portion 77 is exposed. The power generating portion 30 is electrically connected to the conductive portion 77 in the opening 68.

The reinforcement plate 89 is provided to the main surface on the base portion 38 side of the strip-shaped substrate 32 in the wiring substrate 69, and provides slight hardness to the strip-shaped substrate 32, thereby facilitating handling of the wiring substrate 69 during production of the photovoltaic module 10. The reinforcement plate 89 is formed of metal such as aluminium, copper, or the like.

Meanwhile, for example, the coupling portion 33 shown in FIG. 4 includes the FPC 79 and does not include the reinforcement plate 89. The FPC 79 in the strip-shaped substrate 32 and the FPC 79 in the coupling portion 33 are continued to each other. Since the coupling portion 33 does not include the reinforcement plate 89, the coupling portion 33 has higher flexibility than the strip-shaped substrate 32.

Figure 6:
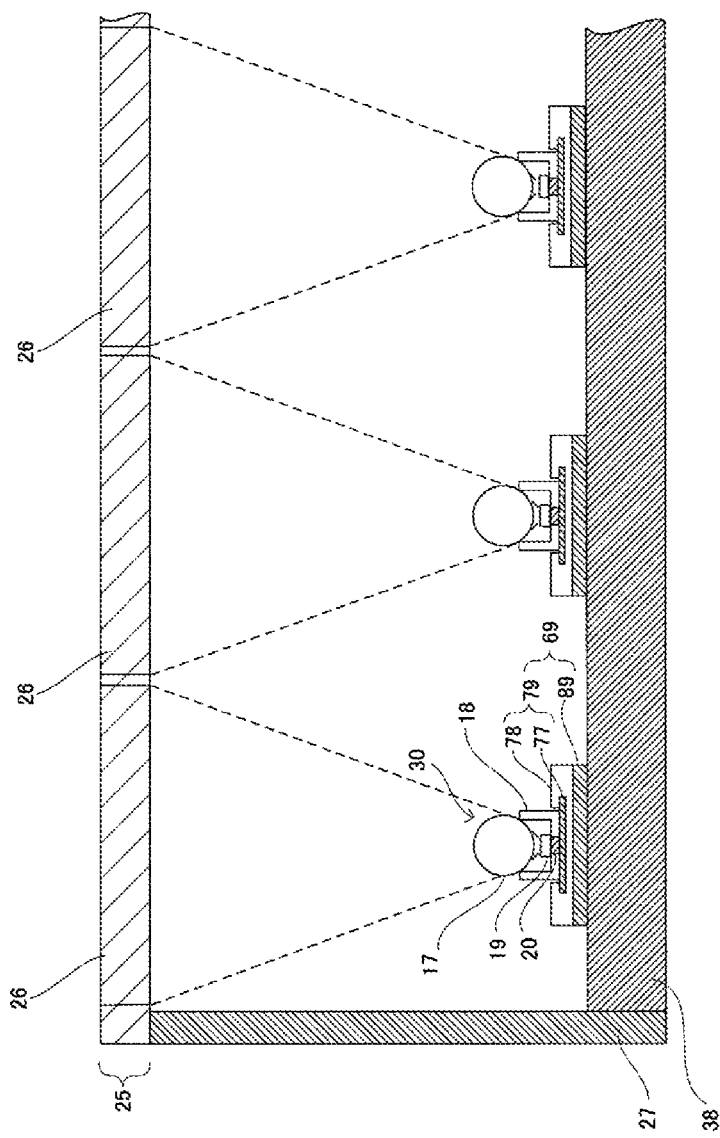
FIG. 6 is a cross-sectional view showing a cross section, along a VI-VI line in FIG. 4, of the photovoltaic module according to the embodiment of the present invention.

FIG. 6 is a cross-sectional view showing a cross section, along the VI-VI line in FIG. 4, of the photovoltaic module according to the embodiment of the present invention.

With reference to FIG. 6, each power generating portion 30 includes a ball lens 17, a package 18, and a power generating element 19. It should be noted that the power generating portion 30 may be configured not to include, except the power generating element 19, any or some of these components.

The wiring substrate 69 is placed at the upper main surface of the base portion 38. The reinforcement plate 89 is provided above the base portion 38. The FPC 79 is provided above the reinforcement plate 89. Specifically, the FPC 79 is provided above the base portion 38 via the reinforcement plate 89.

The power generating element 19 is housed in the package 18. The power generating element 19 is mounted to the FPC 79 in a state of being housed in the package 18. Specifically, the electrode not shown of the power generating element 19 is connected to the conductive portion 77 of the FPC 79, via a package electrode 20 provided so as to penetrate the bottom of the package 18. The size of power generating element 19 is 3.2 mm×3.2 mm, for example.

Each Fresnel lens 26 converges sunlight onto its corresponding ball lens 17. The ball lens 17 further converges the sunlight converged by the Fresnel lens 26, onto the power generating element 19.

The power generating element 19 receives the sunlight converged by the Fresnel lens 26 and the ball lens 17, and generates power corresponding to the amount of the received light.

Figure 7:
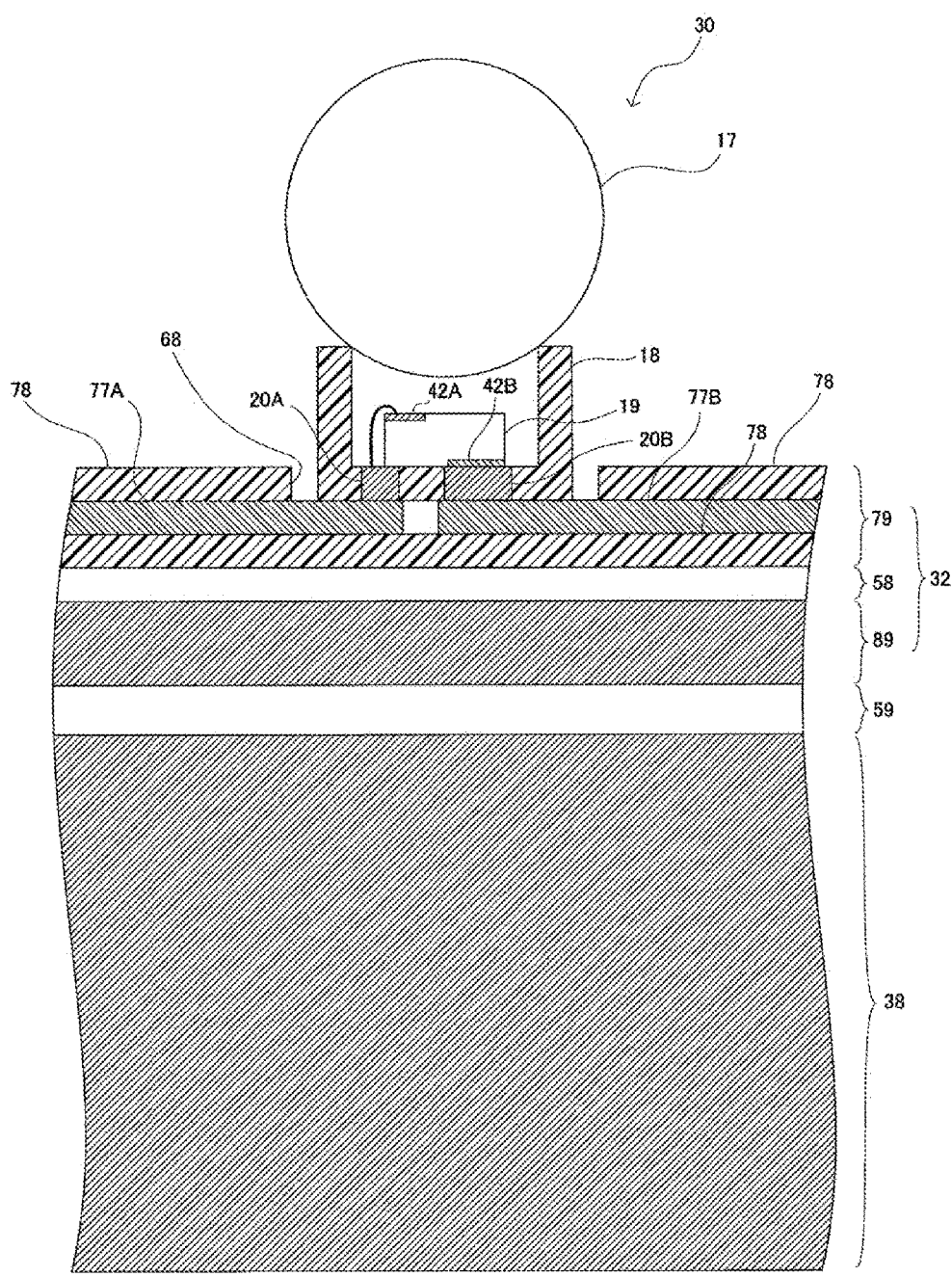
FIG. 7 is a cross-sectional view showing a cross section, along the VII-VII line in FIG. 4, of the photovoltaic module according to the embodiment of the present invention.

FIG. 7 is a cross-sectional view showing a cross section, along the VII-VII line in FIG. 4, of the photovoltaic module according to the embodiment of the present invention.

FIG. 7 also shows an adhesive layer not shown in FIG. 5, for example. Specifically, with reference to FIG. 7, in the strip-shaped substrate 32, the FPC 79 and the reinforcement plate 89 are adhered together by an intra-substrate adhesive layer 58.

The strip-shaped substrate 32 is adhered to the base portion 38 by a base adhesive layer 59. The intra-substrate adhesive layer 58 and the base adhesive layer 59 are each formed from an adhesive agent, an adhesive tape, or the like, for example. On the other hand, for example, the coupling portion 33 shown in FIG. 4 is not adhered to the base portion 38.

The power generating element 19 includes an element electrode 42A and an element electrode 42B, and outputs voltage from the element electrode 42A and the element electrode 42B.

The package 18 includes a package electrode 20A and a package electrode 20B. The package electrode 20A and the package electrode 20B are provided so as to penetrate the bottom of the package 18, and are exposed both on the upper side and the lower side of the bottom.

The element electrode 42A of the power generating element 19 is connected to the package electrode 20A by wire bonding, for example. The element electrode 42B is connected to the package electrode 20B by a conductive paste, for example.

In the opening 68 in the FPC 79, the insulating portion 78 does not cover the upper side of the conductive portion 77, and thus, a part of the conductive portion 77, specifically, a part of a conductive portion 77A and a part of a conductive portion 77B, is exposed.

The package electrode 20A and the package electrode 20B are connected by, for example, soldering to the conductive portion 77A and the conductive portion 77B, respectively.

The package 18 supports the ball lens 17 at the edge of the side wall of the package 18, and fixes the focal point of the ball lens 17 to the power generating element 19.

Figure 8:
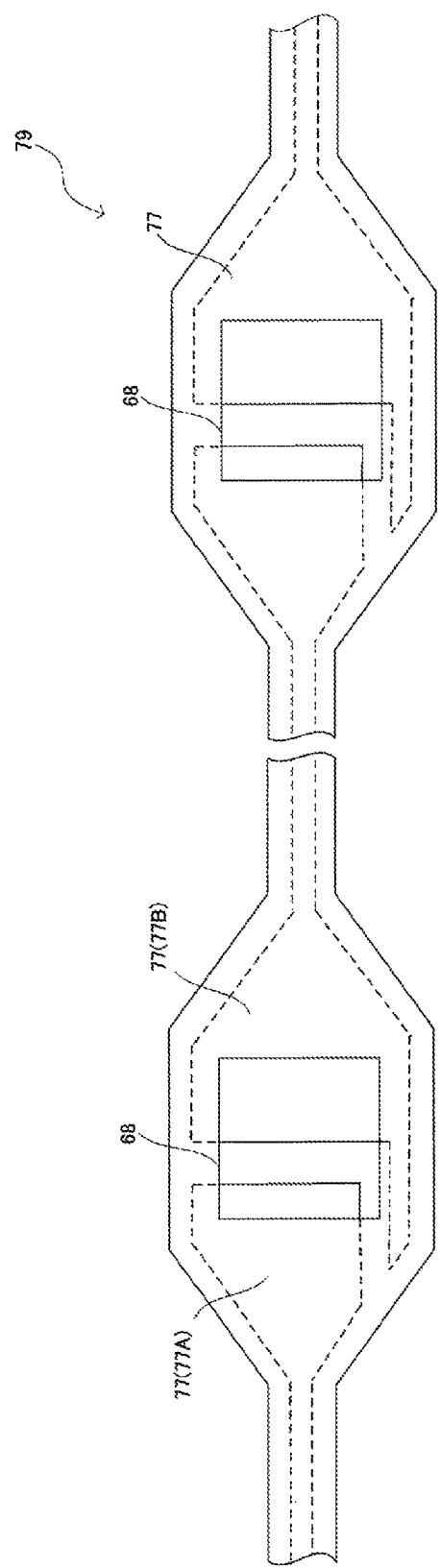
FIG. 8 shows a pattern of a conductive portion of an FPC in a wiring substrate according to the embodiment of the present invention.

FIG. 8 shows a pattern of the conductive portion of the FPC in the wiring substrate according to the embodiment of the present invention.

With reference to FIG. 8, in the opening 68 of the FPC 79, a part of the conductive portion 77 is exposed. Specifically, in the opening 68, a part of the conductive portion 77A and a part of the conductive portion 77B are exposed.

As shown in FIG. 7, for example, the conductive portion 77A and the conductive portion 77B are connected to the element electrode 42A and the element electrode 42B of the power generating element 19, respectively.

The conductive portion 77 connects, in series, the power generating portion 30 mounted in a land portion 60 and the power generating portion 30 mounted in another land portion 60 adjacent to the land portion 60, for example.

Figure 9:
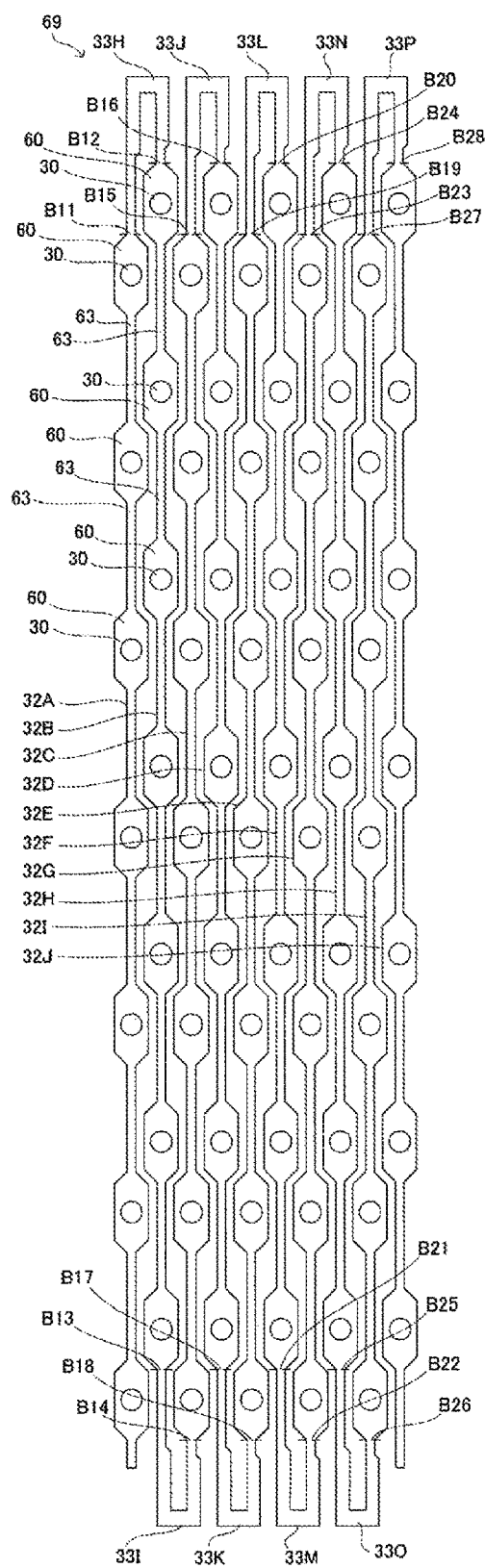
FIG. 9 shows a state in which a coupling portion is not twisted in the wiring substrate according to the embodiment of the present invention.

FIG. 9 shows a state where the coupling portion is not twisted in the wiring substrate according to the embodiment of the present invention.

Borders between the strip-shaped substrates 32 and the coupling portions 33 are defined as borders B11 to B28. In FIG. 9, each coupling portion 33 in the wiring substrate 69 is not twisted. That is, the wiring substrate 69 is in a flat shape.

Each strip-shaped substrate 32 in the wiring substrate 69 shown in FIG. 9 is disposed away from its corresponding adjacent strip-shaped substrate 32 by the distance G2, whereby the wiring substrate 69 shown in FIG. 4 is formed. The coupling portion 33 is twisted as a result of increase in the distance between the two strip-shaped substrates 32 coupled by the coupling portion 33.

Figure 10:
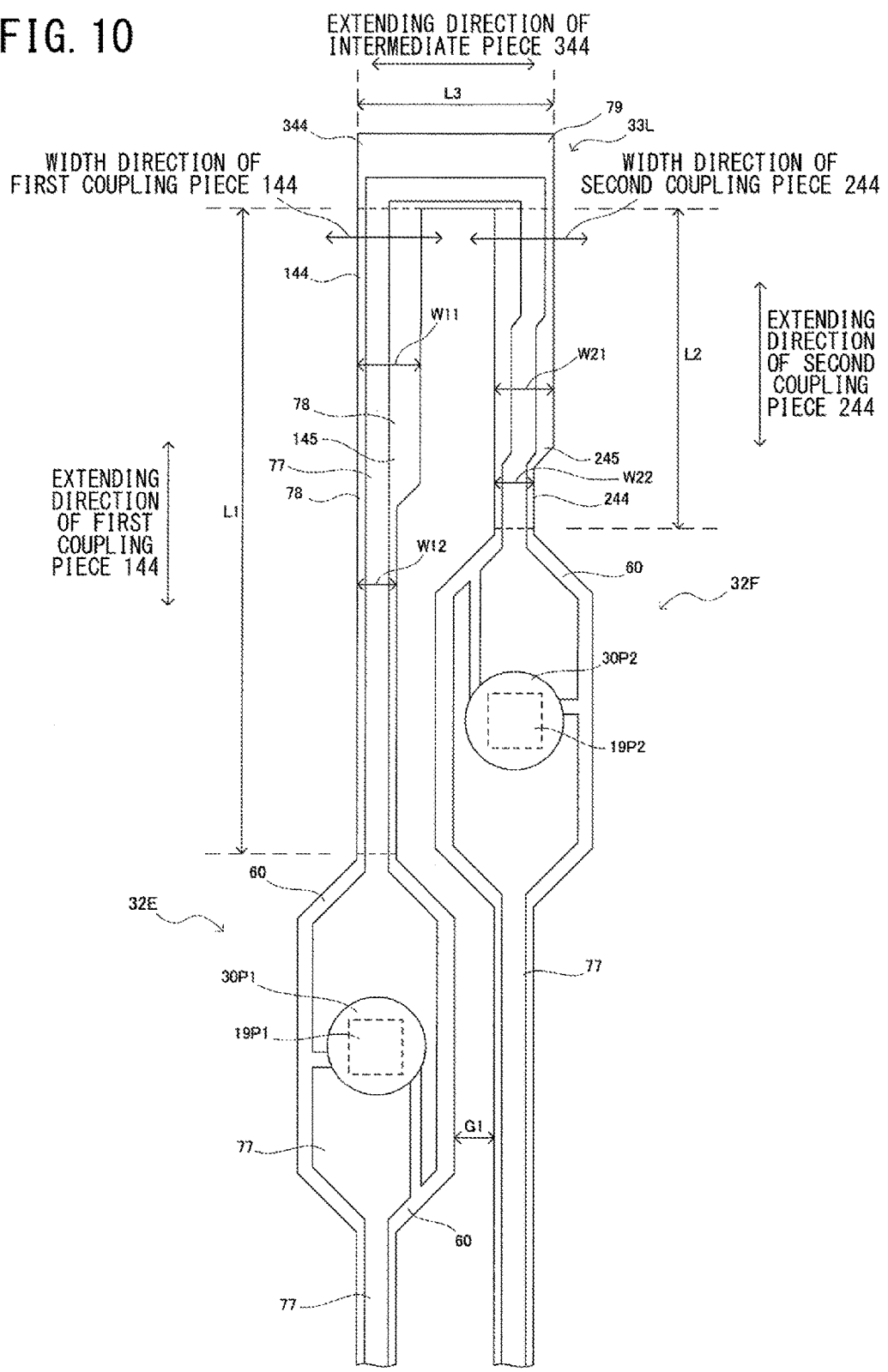
FIG. 10 shows in detail a state where the coupling portion is not twisted in the wiring substrate according to the embodiment of the present invention.

FIG. 10 shows in detail the state where the coupling portion is not twisted in the wiring substrate according to the embodiment of the present invention.

FIG. 10 representatively shows the strip-shaped substrate 32E, the strip-shaped substrate 32F, and the coupling portion 33L. With reference to FIG. 10, the coupling portion 33L has a first coupling piece 144, a second coupling piece 244, and an intermediate piece 344, for example. The first coupling piece 144 connects the strip-shaped substrate 32E and the intermediate piece 344 together. The second coupling piece 244 connects the strip-shaped substrate 32F and the intermediate piece 344 together. The strip-shaped substrate 32E and the strip-shaped substrate 32F are separated from each other by a distance G1.

Hereinafter, in a state where the coupling portion 33L is not twisted as shown in FIG. 10, i.e., in a state where the distance between the strip-shaped substrates 32E and 32F is the distance G1, the position where the strip-shaped substrate 32E is disposed relative to the strip-shaped substrate 32F will also be referred to as a first position.

A length L1 in the extending direction of the first coupling piece 144 is different from a length L2 in the extending direction of the second coupling piece 244, for example. Specifically, for example, the length L1 is greater than the length L2.

In a state where the strip-shaped substrate 32E is disposed at the first position, the extending direction of the intermediate piece 344 is different from the extending direction of the first coupling piece 144, for example. In addition, for example, the extending direction of the intermediate piece 344 is different from the extending direction of the second coupling piece 244.

In the coupling portion 33L, the FPC 79 is continued throughout the first coupling piece 144, the intermediate piece 344, and the second coupling piece 244.

For example, as described above, the FPC 79 has the conductive portion 77 provided along the extending direction of the FPC 79, and the insulating portion 78 covering the conductive portion 77.

For example, the insulating portion 78 in the first coupling piece 144 has a wide portion 145. In the first coupling piece 144, a width W11 of the wide portion 145 is greater than a width W12 of the portion other than the wide portion 145.

The wide portion 145 is formed such that the conductive portion 77 lies closer to the end, on the opposite side to the second coupling piece 244, of the ends in the width direction of the first coupling piece 144.

For example, the insulating portion 78 in the second coupling piece 244 has a wide portion 245. In the second coupling piece 244, a width W21 of the wide portion 245 is greater than a width W22 of the portion other than the wide portion 245.

In the second coupling piece 244, the conductive portion 77 extends from the coupling portion 33L to the strip-shaped substrate 32F in such a manner as to come closer to the first coupling piece 144 stepwise.

Figure 11:
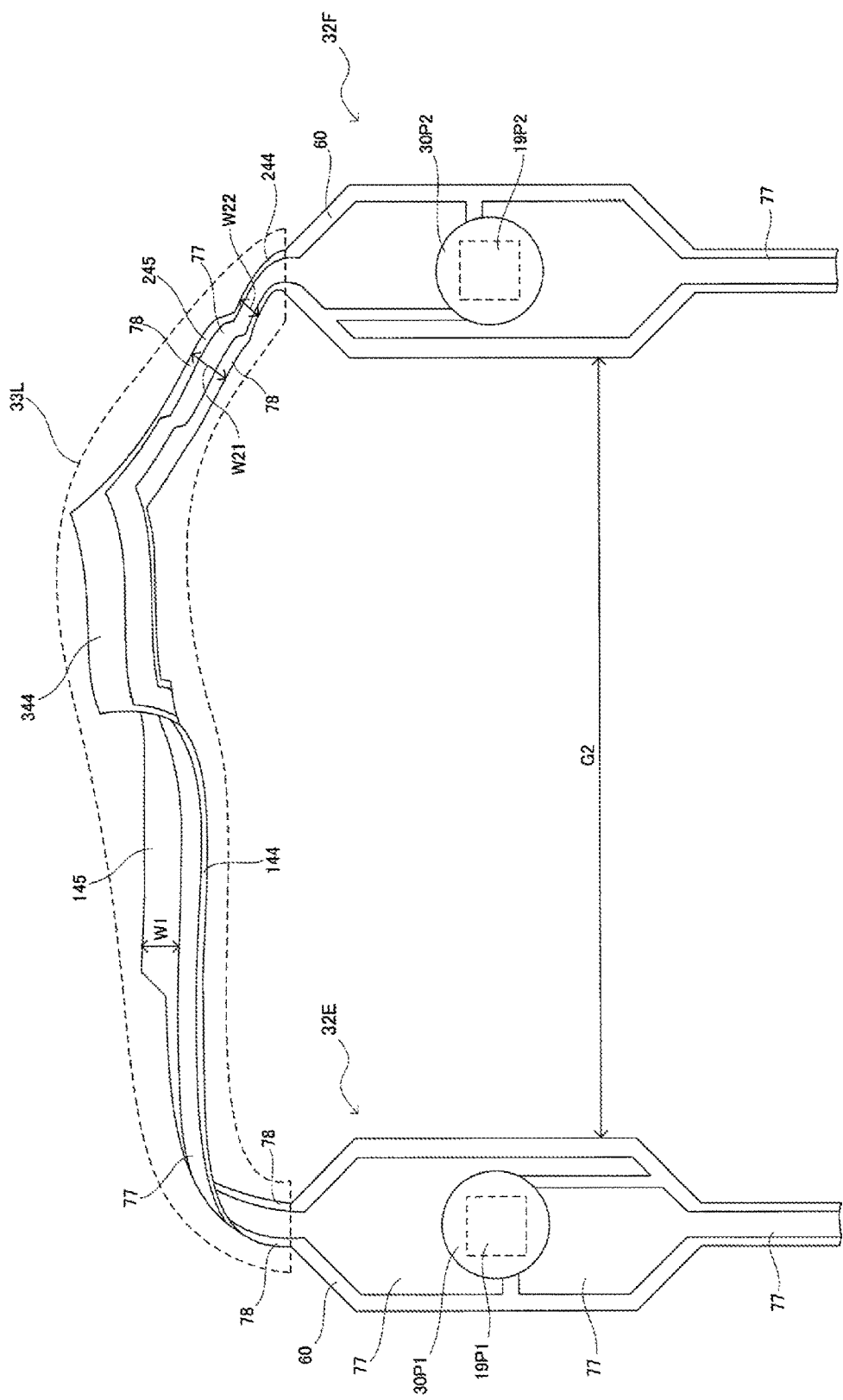
FIG. 11 shows in detail a state where the coupling portion is twisted in the wiring substrate according to the embodiment of the present invention.

FIG. 11 shows in detail a state where the coupling portion is twisted in the wiring substrate according to the embodiment of the present invention.

FIG. 11 representatively shows the state of the strip-shaped substrate 32E, the strip-shaped substrate 32F, and the coupling portion 33L in FIG. 4.

With reference to FIG. 11, the strip-shaped substrate 32E and the strip-shaped substrate 32F are separated from each other by the distance G2 which is greater than the distance G1 shown in FIG. 10.

Hereinafter, in a state where the distance between the strip-shaped substrates 32E and 32F is the distance G2, the position where the strip-shaped substrate 32E is disposed relative to the strip-shaped substrate 32F will also be referred to as a second position.

The strip-shaped substrate 32E can be disposed at least two positions of the first position as shown in FIG. 10 and the second position as shown in FIG. 11. For example, it is possible to create a power generation circuit unit 15 in which the distance between the strip-shaped substrates 32E and 32F is the distance G1, and then, to increase the distance between the strip-shaped substrates 32E and 32F to the distance G2 and set the power generation circuit unit 15 to the base portion 38.

The coupling portion 33L, the strip-shaped substrate 32E, the strip-shaped substrate 32F are integrally formed from a single FPC 79. Thus, compared with a case where a wiring substrate 69 is created that has a wide interval between the strip-shaped substrates 32, the use area of a film being the material of the FPC 79 can be reduced. Thus, the production cost of the power generation circuit unit 15 can be reduced.

Since the strip-shaped substrate 32E and the coupling portion 33L are integrally formed from a single FPC 79, work such as soldering is not required for electrically connecting the strip-shaped substrate 32E and the coupling portion 33L together. This can realize high reliability.

In a state where the strip-shaped substrate 32E is disposed at the second position, the coupling portion 33L is twisted. Specifically, for example, the first coupling piece 144, the second coupling piece 244, and the intermediate piece 344 are twisted.

The strip-shaped substrate 32E and the strip-shaped substrate 32F located at both side of the coupling portion 33L in the twisted state are opposed to each other.

In other words, the coupling portion 33L is twisted such that the strip-shaped substrate 32E and the strip-shaped substrate 32F are opposed to each other. Specifically, the coupling portion 33L is twisted such that the power generating portion 30 mounted to the strip-shaped substrate 32E and the power generating portion 30 mounted to the strip-shaped substrate 32F are opposed to each other.

Not limited to the configuration in which the entirety of the coupling portion 33L is twisted in a state where the strip-shaped substrate 32E is disposed at the second position, a configuration may be employed in which a part of the coupling portion 33L is twisted in a state where the strip-shaped substrate 32E is disposed at the second position. For example, it is sufficient that, in a state where the strip-shaped substrate 32E is disposed at the second position, at least one of the first coupling piece 144, the second coupling piece 244, and the intermediate piece 344 is twisted.

Figure 12:
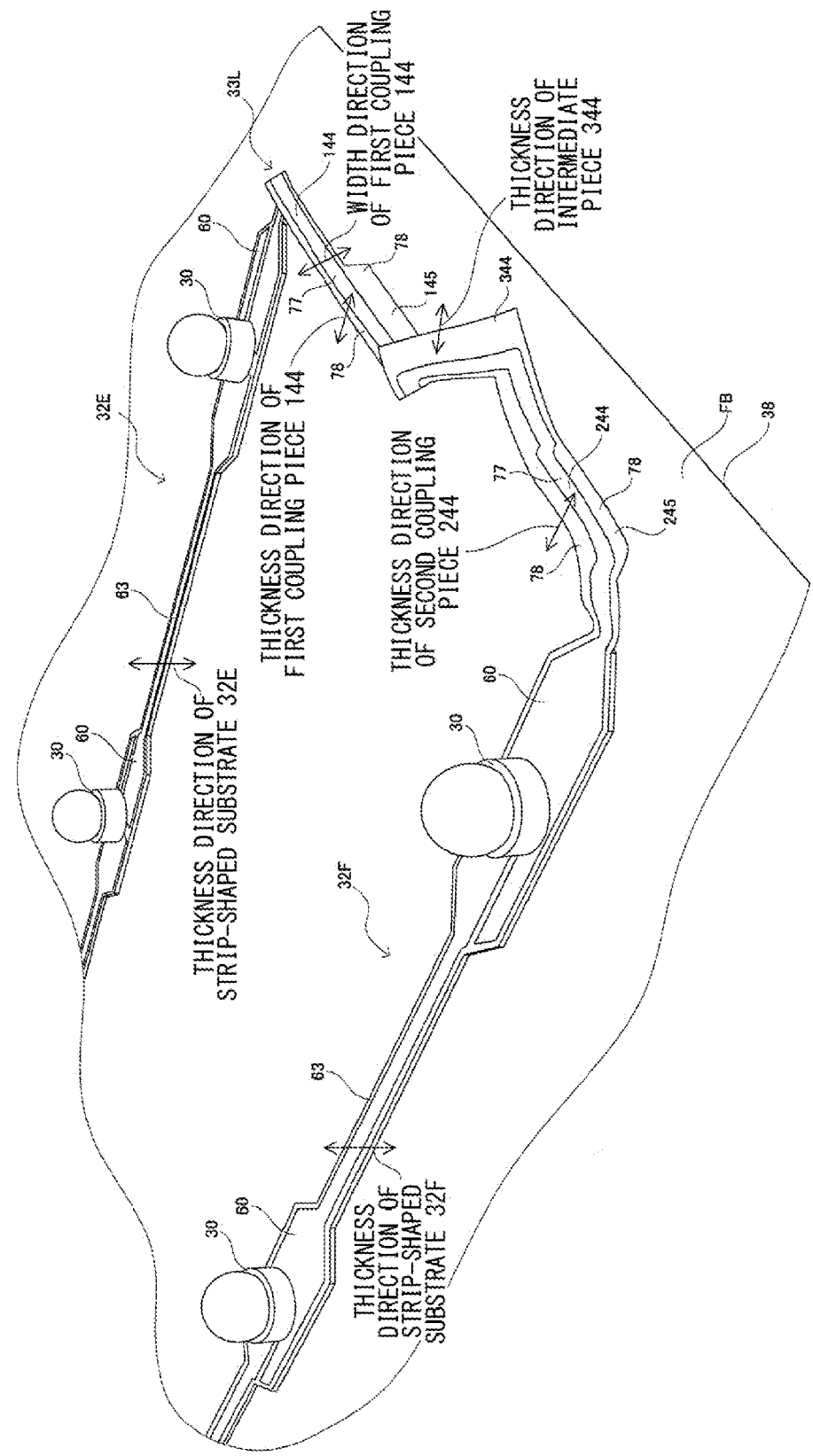
FIG. 12 is a perspective view showing a state where the coupling portion is twisted in the wiring substrate according to the embodiment of the present invention.
Figure 13:
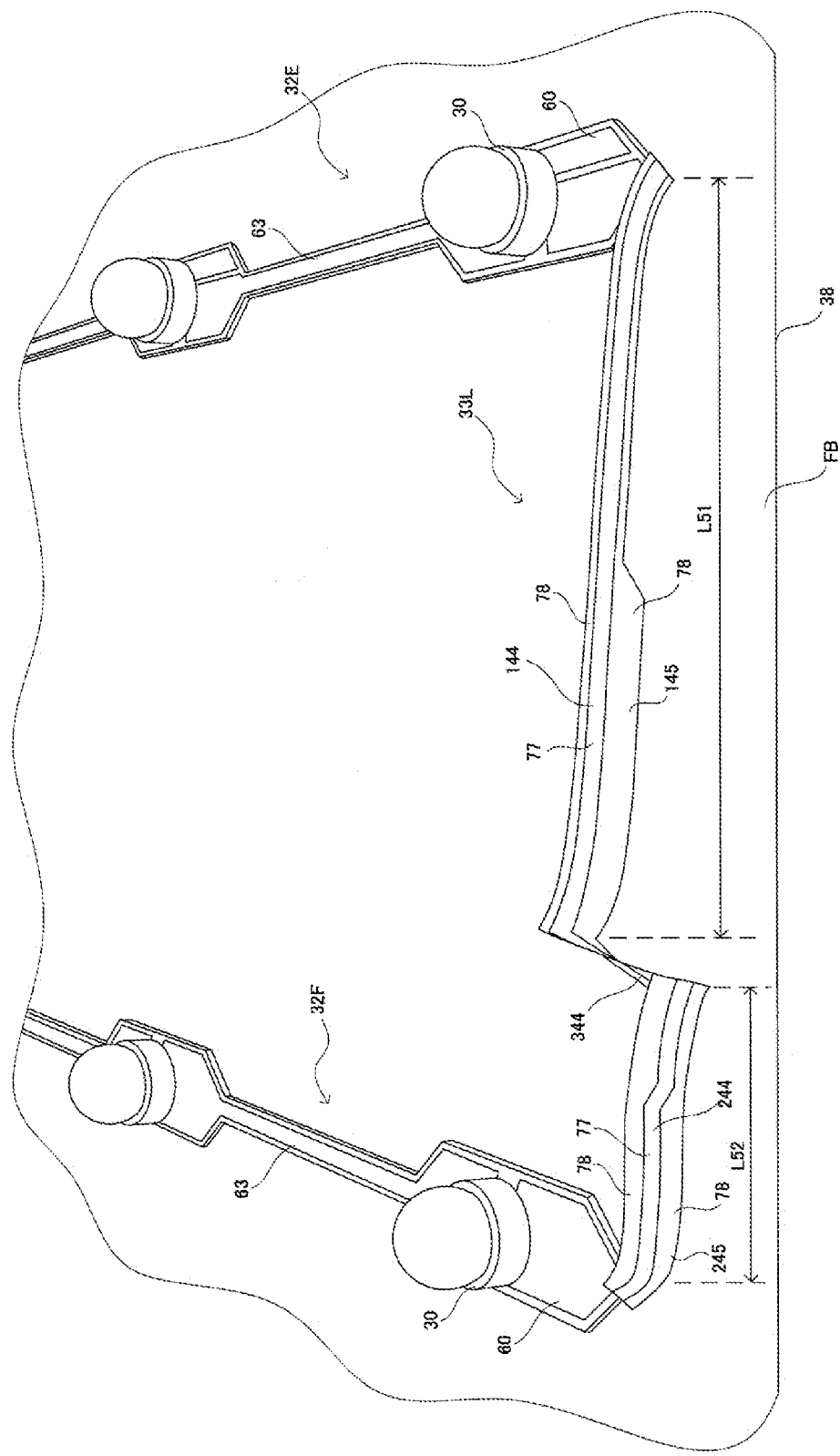
FIG. 13 is a perspective view showing a state where the coupling portion is twisted in the wiring substrate according to the embodiment of the present invention.

Each of FIG. 12 and FIG. 13 is a perspective view showing a state where the coupling portion is twisted in the wiring substrate according to the embodiment of the present invention.

Each of FIG. 12 and FIG. 13 shows the twisted coupling portion 33L viewed from an angle different from that in FIG. 11. With reference to FIG. 12 and FIG. 13, in a state where the strip-shaped substrate 32E is disposed at the second position, a part of the coupling portion 33L is located above the height positions of the strip-shaped substrate 32E and the strip-shaped substrate 32F.

Specifically, for example, the first coupling piece 144 is positioned above the height position of the strip-shaped substrate 32E. The intermediate piece 344 is positioned above the height position of the strip-shaped substrate 32E.

It is sufficient that, in a state where the strip-shaped substrate 32E is disposed at the second position, at least a part of the coupling portion 33L is positioned above the height position of either one of the strip-shaped substrate 32E and the strip-shaped substrate 32F.

For example, the thickness direction of at least a part of the first coupling piece 144 is different from the thickness direction of the strip-shaped substrate 32E.

For example, the thickness direction of at least a part of the second coupling piece 244 is different from the thickness direction of the strip-shaped substrate 32F.

For example, the thickness direction of at least a part of the intermediate piece 344 is different from the thickness direction of at least one of the first coupling piece 144 and the second coupling piece 244.

A distance L51 between the strip-shaped substrate 32E and the intermediate piece 344 is different from a distance L52 between the strip-shaped substrate 32F and the intermediate piece 344. Specifically, the distance L51 is greater than the distance L52.

The wide portion 145 and the wide portion 245 are positioned so as to stand relative to the face of the base portion 38 where the wiring substrate 69 is placed, i.e. the upper face FB of the base portion 38. Accordingly, a distance can be ensured to some extent between the face FB and the conductive portion 77 in the FPC 79.

Specifically, in the wide portion 145, the conductive portion 77 is positioned closer to the end, on the opposite side to the face FB, of the ends in the width direction of the first coupling piece 144.

The strip-shaped substrate 32E, the strip-shaped substrate 32F, and the coupling portion 33L have been representatively described with reference to FIG. 10 to FIG. 13. However, the same also applies to other strip-shaped substrates 32 and coupling portions 33.

Meanwhile, in the concentrator solar cell module described in PATENT LITERATURE 1, when sunlight is converged onto a solar cell element by a lens, the temperature of the solar cell element becomes high. When heat of the solar cell element is transferred to the receiver substrate to which the solar cell element is mounted, the receiver substrate expands due to heat.

The receiver substrate having thermally expanded due to sunlight during daytime contracts to its original size from evening, for example. When the receiver substrate repeats expansion and contraction in this manner, the receiver substrate is degraded early in some cases.

In contrast to this, in the power generation circuit unit according to the embodiment of the present invention, the power generating element 19 is mounted to each of the strip-shaped substrate 32E (first substrate) and the strip-shaped substrate 32F (second substrate). The coupling portion 33L couples the strip-shaped substrate 32E and the strip-shaped substrate 32F together. The strip-shaped substrate 32E can be disposed at at least two positions of: the first position separated from the strip-shaped substrate 32F by the distance G1 (first distance); and the second position separated from the strip-shaped substrate 32F by the distance G2 (second distance). The distance G2 is greater than the distance G1. The coupling portion 33L has the FPC 79. In a state where the strip-shaped substrate 32E is disposed at the second position, at least a part of the coupling portion 33L is twisted.

With this configuration, the coupling portion 33L can be easily twisted by changing the arrangement of the strip-shaped substrate 32E. In a state where the coupling portion 33L is twisted, for example, air flowing around the wiring substrate 69 easily hits the coupling portion 33L. Thus, heat transferred from the power generating element 19 to the wiring substrate 69 can be efficiently released from the coupling portion 33L into air.

Therefore, it is possible to suppress temperature increase of the substrate to which the power generating element is mounted.

In the power generation circuit unit according to the embodiment of the present invention, in a state where the strip-shaped substrate 32E is disposed at the second position, at least a part of the coupling portion 33L is positioned above the height position of at least either one of the strip-shaped substrate 32E and the strip-shaped substrate 32F.

With this configuration, a greater flow of air easily hits the coupling portion 33L, and thus, the heat dissipation efficiency of the coupling portion 33L can be further enhanced.

In the power generation circuit unit according to the embodiment of the present invention, the first coupling piece 144 connects the strip-shaped substrate 32E and the intermediate piece 344 together. The second coupling piece 244 connects the strip-shaped substrate 32F and the intermediate piece 344 together.

Thus, with the configuration in which the coupling portion 33L is divided into a plurality of sections, the coupling portion 33L can be easily twisted.

In the power generation circuit unit according to the embodiment of the present invention, in a state where the strip-shaped substrate 32E is disposed at the second position, at least one of the first coupling piece 144, the second coupling piece 244, and the intermediate piece 344 is twisted.

With this configuration, while making the coupling portion 33L more easily twisted, it is possible to enhance the heat dissipation efficiency of the coupling portion 33L.

In the power generation circuit unit according to the embodiment of the present invention, in a state where the strip-shaped substrate 32E is disposed at the second position, both of the first coupling piece 144 and the second coupling piece 244 are twisted.

With this configuration, while making the coupling portion 33L more easily twisted, it is possible to further enhance the heat dissipation efficiency of the coupling portion 33L.

In the power generation circuit unit according to the embodiment of the present invention, in a state where the strip-shaped substrate 32E is disposed at the second position, the first coupling piece 144 is positioned above the height position of the strip-shaped substrate 32E.

With this configuration, the heat dissipation efficiency of the coupling portion 33L can be further enhanced.

In the power generation circuit unit according to the embodiment of the present invention, in a state where the strip-shaped substrate 32E is disposed at the second position, the intermediate piece 344 is positioned above the height position of the strip-shaped substrate 32E.

With this configuration, the heat dissipation efficiency of the coupling portion 33L can be further enhanced.

In the power generation circuit unit according to the embodiment of the present invention, the length L1 in the extending direction of the first coupling piece 144 is different from the length L2 in the extending direction of the second coupling piece 244.

With this configuration, for example, in a case where there are a plurality of the coupling portions 33 in the wiring substrate 69, the twisting manner of the coupling portions 33 can be more reliably unified.

For example, in a state where the strip-shaped substrate 32E is disposed at the first position, i.e., in a state where the wiring substrate 69 is in a flat shape, the strip-shaped substrate 32E is positioned so as to be shifted in the longitudinal direction relative to the strip-shaped substrate 32F. Accordingly, for example, since the land portion 60 in the strip-shaped substrate 32E is positioned so as to be shifted relative to the land portion 60 in the strip-shaped substrate 32F, it is possible to create a wiring substrate 69 in which the strip-shaped substrates 32 are densely provided.

In the power generation circuit unit according to the embodiment of the present invention, in a state where the strip-shaped substrate 32E is disposed at the first position, the extending direction of the intermediate piece 344 is different from the extending direction of the first coupling piece 144.

With this configuration, the coupling portion 33L can be more easily twisted.

In the power generation circuit unit according to the embodiment of the present invention, in a state where the strip-shaped substrate 32E is disposed at the first position, the extending direction of the intermediate piece 344 is different from the extending direction of the second coupling piece 244.

With this configuration, the coupling portion 33L can be further easily twisted.

In the power generation circuit unit according to the embodiment of the present invention, in a state where the strip-shaped substrate 32E is disposed at the second position, the thickness direction of at least a part of the first coupling piece 144 is different from the thickness direction of the strip-shaped substrate 32E.

With this configuration, air flowing around the wiring substrate 69 easily hits the coupling portion 33L, and thus, the heat dissipation efficiency of the coupling portion 33L can be enhanced.

In the power generation circuit unit according to the embodiment of the present invention, in a state where the strip-shaped substrate 32E is disposed at the second position, the thickness direction of at least a part of the second coupling piece 244 is different from the thickness direction of the strip-shaped substrate 32F.

With this configuration, air flowing around the wiring substrate 69 more easily hits the coupling portion 33L, and thus, the heat dissipation efficiency of the coupling portion 33L can be further enhanced.

In the power generation circuit unit according to the embodiment of the present invention, in a state where the strip-shaped substrate 32E is disposed at the second position, the thickness direction of at least a part of the intermediate piece 344 is different from the thickness direction of at least one of the first coupling piece 144 and the second coupling piece 244.

With this configuration, air flowing around the wiring substrate 69 easily hits the coupling portion 33L, and thus, the heat dissipation efficiency of the coupling portion 33L can be enhanced.

In the power generation circuit unit according to the embodiment of the present invention, in a state where the strip-shaped substrate 32E is disposed at the second position, the distance L51 between the strip-shaped substrate 32E and the intermediate piece 344 is different from the distance L52 between the strip-shaped substrate 32F and the intermediate piece 344.

With this configuration, for example, in a case where there are a plurality of the coupling portions 33 in the wiring substrate 69, the twisting manner of the coupling portions 33 can be more reliably unified.

In the power generation circuit unit according to the embodiment of the present invention, the FPC 79 is continued throughout the first coupling piece 144, the intermediate piece 344, and the second coupling piece 244. The FPC 79 has the conductive portion 77 provided along the extending direction of the FPC 79, and the insulating portion 78 covering the conductive portion 77. The insulating portion 78 of at least either one of the first coupling piece 144 and the second coupling piece 244 has a wide portion.

With this configuration, for example, in a state where the coupling portion 33L is twisted, in a case where the wide portion is positioned so as to stand relative to the face FB where the wiring substrate 69 is placed, a distance between the conductive portion 77 and the face FB can be ensured to some extent. Thus, occurrence of electric discharge between the conductive portion 77 and the face FB can be prevented.

The above embodiments are merely illustrated in all aspects and should not be recognized as being restrictive. The scope of the present invention is defined by the scope of the claims rather than by the description above, and is intended to include meaning equivalent to the scope of the claims and all modifications within the scope.

The above description includes the features in the additional notes below.

[Additional Note 1]

A power generation circuit unit comprising:
  a wiring substrate; and
  a plurality of power generating elements mounted to the wiring substrate, wherein
  the wiring substrate includes:
    a first substrate and a second substrate to each of which the power generating element is mounted; and
    a coupling portion configured to couple the first substrate and the second substrate together,
  the first substrate can be disposed at least two positions of: a first position separated from the second substrate by a first distance; and a second position separated from the second substrate by a second distance being greater than the first distance,
  the coupling portion has an FPC (flexible printed circuits),
  in a state where the first substrate is disposed at the second position, at least a part of the coupling portion is twisted,
  the power generation circuit unit is used in a photovoltaic apparatus, and in the photovoltaic apparatus, sunlight converged by a lens is applied to the power generating element.

REFERENCE SIGNS LIST 10 photovoltaic module
12 photovoltaic panel
13 sun direction sensor
14 frame part
15 power generation circuit unit
17 ball lens
18 package
19 power generating element
20, 20A, 20B package electrode
25 concentrating portion
26 Fresnel lens
27 wall portion
30, 30P1, 30P2, 30Q1, 30Q2, 30R1, 30R2 power generating portion
32, 32A, 32B, 32C, 32D, 32E, 32F, 32G, 32H, 32I, 32J strip-shaped substrate
33, 33F, 33H, 33I, 33J, 33K, 33L, 33M, 33N, 33O, 33P coupling portion
38 base portion
39 lead wire
40 pedestal
42A, 42B element electrode
46 base
48 post
58 intra-substrate adhesive layer
59 base adhesive layer
60 land portion
63 wire portion
68 opening
69 wiring substrate
77, 77A, 77B conductive portion
78 insulating portion
79 FPC
89 reinforcement plate
90 function part
101 photovoltaic apparatus
144 first coupling piece
145 wide portion
244 second coupling piece
245 wide portion
344 intermediate piece

The invention claimed is:

1. A power generation circuit unit comprising:
a wiring substrate provided on a base portion; and
a plurality of power generating elements mounted to the wiring substrate, wherein
the wiring substrate includes:
  a strip-shaped first substrate provided on the base portion and including the power generating element mounted to the strip shaped first substrate;
  a strip-shaped second substrate provided on the base portion and including the power generating element mounted to the strip-shaped second substrate; and
  a coupling portion configured to couple an end of the first substrate and an end of the second substrate together and being strip-shaped,
the first substrate can be disposed at least two positions of:
  a first position separated from the second substrate by a first distance; and a second position separated from the second substrate by a second distance being greater than the first distance,
the coupling portion has an FPC (flexible printed circuits), and
in a state where the first substrate is disposed at the second position, at least a part of the coupling portion is twisted.

2. The power generation circuit unit according to claim 1, wherein
in a state where the first substrate is disposed at the second position, at least a part of the coupling portion is positioned above a height position of at least either one of the first substrate and the second substrate.

3. The power generation circuit unit according to claim 1, wherein
the coupling portion has a first coupling piece, a second coupling piece, and an intermediate piece,
the first coupling piece connects the first substrate and the intermediate piece together, and
the second coupling piece connects the second substrate and the intermediate piece together.

4. The power generation circuit unit according to claim 3, wherein
in a state where the first substrate is disposed at the second position, at least one of the first coupling piece, the second coupling piece, and the intermediate piece is twisted.

5. The power generation circuit unit according to claim 3, wherein
in a state where the first substrate is disposed at the second position, both of the first coupling piece and the second coupling piece are twisted.

6. The power generation circuit unit according to claim 3, wherein
in a state where the first substrate is disposed at the second position, the first coupling piece is positioned above a height position of the first substrate.

7. The power generation circuit unit according to claim 3, wherein
in a state where the first substrate is disposed at the second position, the intermediate piece is positioned above a height position of the first substrate.

8. The power generation circuit unit according to claim 3, wherein
a length in an extending direction of the first coupling piece is different from a length in an extending direction of the second coupling piece.

9. The power generation circuit unit according to claim 3, wherein
in a state where the first substrate is disposed at the first position, an extending direction of the intermediate piece is different from an extending direction of the first coupling piece.

10. The power generation circuit unit according to claim 9, wherein
in a state where the first substrate is disposed at the first position, the extending direction of the intermediate piece is different from an extending direction of the second coupling piece.

11. The power generation circuit unit according to claim 3, wherein
in a state where the first substrate is disposed at the second position, a thickness direction of at least a part of the first coupling piece is different from a thickness direction of the first substrate.

12. The power generation circuit unit according to claim 11, wherein
in a state where the first substrate is disposed at the second position, a thickness direction of at least a part of the second coupling piece is different from a thickness direction of the second substrate.

13. The power generation circuit unit according to claim 3, wherein
in a state where the first substrate is disposed at the second position, a thickness direction of at least a part of the intermediate piece is different from a thickness direction of at least one of the first coupling piece and the second coupling piece.

14. The power generation circuit unit according to claim 3, wherein
in a state where the first substrate is disposed at the second position, a distance between the first substrate and the intermediate piece is different from a distance between the second substrate and the intermediate piece.

15. The power generation circuit unit according to claim 3, wherein
the FPC is continued throughout the first coupling piece, the intermediate piece, and the second coupling piece,
the FPC has:
a conductive portion provided along an extending direction of the FPC; and
an insulating portion configured to cover the conductive portion, and
the insulating portion of at least either one of the first coupling piece and the second coupling piece has a wide portion.

* * * * *